United States Patent
Cina

(10) Patent No.: US 7,141,818 B2
(45) Date of Patent: Nov. 28, 2006

(54) OPTICAL DEVICE

(75) Inventor: Salvatore Cina, Rennes (FR)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 10/488,073

(22) PCT Filed: Aug. 23, 2002

(86) PCT No.: PCT/GB02/03882

§ 371 (c)(1),
(2), (4) Date: Jul. 26, 2004

(87) PCT Pub. No.: WO03/019696

PCT Pub. Date: Mar. 6, 2003

(65) Prior Publication Data

US 2004/0251459 A1   Dec. 16, 2004

(30) Foreign Application Priority Data

Aug. 25, 2001 (GB) ................................. 0120746.3
Apr. 3, 2002 (GB) ................................. 0207704.8

(51) Int. Cl.
*H01L 51/00* (2006.01)
(52) U.S. Cl. ................................. 257/40; 257/E51.018
(58) Field of Classification Search ................. 257/40; 313/498, 499, 500, 501, 502, 503, 504, 505, 313/506, 507, 508, 509, 510, 511, 512; 428/690
See application file for complete search history.

(56) References Cited

U.S. PATENT DOCUMENTS

| | | | |
|---|---|---|---|
| 4,539,507 A | 9/1985 | VanSlyke et al. | 313/504 |
| 5,776,622 A | 7/1998 | Hung et al. | 428/690 |
| 5,989,738 A * | 11/1999 | Haase et al. | |
| 6,248,458 B1 | 6/2001 | Yoon et al. | 428/690 |
| 6,278,236 B1 | 8/2001 | Madathil et al. | 313/504 |
| 2001/0033135 A1 * | 10/2001 | Duggal et al. | |

FOREIGN PATENT DOCUMENTS

| | | |
|---|---|---|
| EP | 817 281 A2 | 1/1998 |
| EP | 817 281 A3 | 1/1998 |
| EP | 822 603 A2 | 2/1998 |
| EP | 822 603 A3 | 2/1998 |
| EP | 869 701 A2 | 10/1998 |
| EP | 869 701 A3 | 10/1998 |
| EP | 880 303 A1 | 11/1998 |
| EP | 893 940 A1 | 1/1999 |
| EP | 1 058 484 | 12/2000 |
| JP | 2000-223276 | 8/2000 |
| WO | WO 90/13148 | 11/1990 |
| WO | WO 96/16449 | 5/1996 |

(Continued)

OTHER PUBLICATIONS

Kido et al., "Bright Organic Electroluminescent Devices with Double-Layer Cathode," IEEE Transactions on Electron Devices, Jul. 1993, vol. 40, issue 7, p. 1342-1344.*

(Continued)

*Primary Examiner*—Nathan J. Flynn
*Assistant Examiner*—Kevin Quinto
(74) *Attorney, Agent, or Firm*—Marshall, Gerstein & Borun LLP

(57) ABSTRACT

An optical device comprising an anode, a cathode, an organic semiconducting material between the anode and the cathode, and an electron transport layer between the cathode and the organic semiconducting material wherein the organic semiconducting material comprises sulfur and the electron transport layer containing barium.

64 Claims, 5 Drawing Sheets

FOREIGN PATENT DOCUMENTS

| | | |
|---|---|---|
| WO | WO 99/54385 | 10/1999 |
| WO | WO 00/46321 | 8/2000 |
| WO | WO 00/48257 | 8/2000 |
| WO | WO 00/55927 | 9/2000 |
| WO | WO 01/06576 | 1/2001 |

OTHER PUBLICATIONS

Brown et al., "Energy level line-up in polymer light-emitting diode via electroabsorption spectroscopy," IEEE Proceedings—Optoelectronics, Feb. 2001, vol. 148, issue 1, p. 74-80.*

"A Novel RGB Multicolor Light-Emitting Polymer Display", Kobayashi et al., Synthetic Metals 111-112, 2000, pp. 125-128.

"Efficient Polymer Light Emitting Diodes With Metal Fluoride/Al Cathodes", Yang et al., Applied Physics Letters, vol. 79, No. 5, Jul. 30, 2001, pp. 563-565.

International Search Report in PCT/GB02/03882 dated Jul. 2, 2003.

International Preliminary Examination Report in PCT/GB02/03882 dated Nov. 5, 2003.

* cited by examiner

OPTICAL DEVICE

This is the U.S. national phase of International Application No. PCT/GB02/03882 filed Aug. 23, 2002, the entire disclosure of which is incorporated herein by reference.

FIELD OF THE INVENTION

The invention relates to cathodes for optical devices, in particular organic electroluminescent and photovoltaic devices.

BACKGROUND OF THE INVENTION

One class of opto-electrical devices is that using an organic material for light emission or as the active component of a photocell or photodetector (a "photovoltaic" device). The basic structure of these devices is a semiconducting organic layer sandwiched between a cathode for injecting or accepting negative charge carriers (electrons) and an anode for injecting or accepting positive charge carriers (holes) into the organic layer.

In an organic electroluminescent device, electrons and holes are injected into the semiconducting organic layer where they combine in to generate excitons that undergo radiative decay. In WO 90/13148 the organic light-emissive material is a polymer, namely poly (p-phenylenevinylene) ("PPV"). Other light emitting polymers known in the art include polyfluorenes and polyphenylenes. In U.S. Pat. No. 4,539,507 the organic light-emissive material is of the class known as small molecule materials, such as (8-hydroxyquinoline) aluminum ("Alq3"). In a practical device one of the electrodes is transparent, to allow photons to escape the device.

A organic photovoltaic device has the same construction as an organic electroluminescent device, however charge is separated rather than combined as described in, for example, WO 96/16449.

FIG. 1 illustrates the cross-sectional structure of a typical organic light-emissive device ("OLED"). The OLED is typically fabricated on a glass or plastic substrate 1 coated with a transparent first electrode 2 such as indium-tin-oxide ("ITO"). A layer of a thin film of at least one electroluminescent organic material 3 covers the first electrode. Finally, a cathode 4 covers the layer of electroluminescent organic material. The cathode is typically a metal or alloy and may comprise a single layer, such as aluminum, or a plurality of layers such as calcium and aluminum. Other layers can be added to the device, for example to improve charge injection from the electrodes to the electroluminescent material. For example, a hole injection layer such as poly(ethylene dioxythiophene)/polystyrene sulfonate (PEDOT-PSS) or polyaniline may be provided between the anode 2 and the electroluminescent material 3. When a voltage is applied between the electrodes from a power supply one of the electrodes acts as a cathode and the other as an anode.

The nature of the electrodes has a strong influence on the efficiency, and also lifetime, of the device. For the cathode electrode a number of materials have been proposed, with materials having a low work-function being generally preferred. The inclusion of a high dipole dielectric layer between the cathode and the electroluminescent layer has been shown to improve device efficiency by assisting electron injection. For example, EP 0822603 discloses a thin fluoride layer between the EL layer and a thick conductive layer. The fluoride can be selected from the group of alkali fluorides and alkali earth fluorides. The conductive layer can be selected from the group of elemental metals, metal alloys and conductive materials. For the fluoride layer thicknesses in the range 0.3 nm to 5.0 nm are taught. Similarly, Applied Physics Letters 79(5), 2001, 563–565 discloses metal fluoride/Al cathodes. In addition, WO 00/48257 describes an arrangement comprising a metal fluoride layer, a layer of calcium and a layer of aluminum.

A focus in the field of OLEDs has been the development of full color displays utilizing organic red, green and blue (RGB) electroluminescent materials. To this end, a large body of work has been reported in the development of both small molecule and polymeric red, green and blue emitters. These emitters comprise aromatic moieties which may carry substituents. Appropriate selection of the aromatic moiety, and/or the substituents therefor, enables tuning of the color of emission. Electroluminescent materials comprising sulfur, such as polymers comprising thiophene or benzothiadiazole repeat units, have been reported. For example, red and green emitters comprising these units are disclosed in WO 00/46321.

Full color OLEDs have been disclosed in, for example, Synthetic Metals 111–112 (2000), 125–128. A difficulty with thesedevicesispoororoveralldeviceperformance(i.e.efficiency, lifetime, etc.) resulting from incompatibility of the cathode with at least one of the red green and blue emitters. For example, the cathode disclosed in Synthetic Metals 111–112 (2000), 125–128 is LiF/Ca/Al which is particularly efficacious with respect to the blue emissive material but which shows poor performance with respect to green and, especially, red emitters. A particular problem of degradation in green and red efficiency has been observed when pixels of these colors are not driven.

The present inventors have identified deleterious interactions between the cathode and sulfur containing materials in the aforementioned devices. In addition to the deleterious effect of this interaction on an OLED, the same deleterious interaction will affect the semiconducting properties of the organic material in an organic photovoltaic device. It is therefore a purpose of the invention to provide a cathode that has improved compatibility with organic semiconducting materials comprising sulfur. It is a further purpose of the invention to provide a cathode which has improved compatibility with all of red, green and blue electroluminescent organic semiconducting materials.

SUMMARY OF THE INVENTION

In a first aspect, the invention provides an optical device comprising
    an anode
    a cathode
    an organic semiconducting material between the anode and the cathode and
    an electron transport layer between the cathode and the organic semiconducting material
wherein the organic semiconducting material comprises sulfur and the electron transport layer comprises barium.

In one preferred embodiment of the first aspect of the invention, the optical device is an electroluminescent device, more preferably a display device. In a second preferred embodiment of the first aspect of the invention, the optical device is a photovoltaic device.

In a second aspect, the invention provides an optical device comprising an anode, a cathode, red, green and blue electroluminescent organic semiconducting materials located between the anode and the cathode and an electron transport layer located between the electroluminescent organic semiconducting materials and the cathode wherein the electron transport layer comprises barium.

In one preferred aspect, the electron transport layer comprises elemental barium as a major component. In this aspect, the electron transport layer may be regarded as a further component of the cathode since it is a conductive material. In another preferred aspect, the electron transport layer comprises a dielectric barium compound as a major component. Preferred dielectric barium compounds include barium halides and barium oxide, most preferably barium fluoride. Preferably the layer comprising barium has a thickness in the range of 1–6 nm.

Without wishing to be bound by any theory, it is believed that when a sufficiently thin dielectric layer is used, the properties of the overlying cathode layer can influence charge injection from the cathode into the emissive layer, there is an opportunity to select materials for the cathode such that by a combination of their properties the performance of the device can be enhanced. Possible mechanisms for this enhancement are believed to include: (a) prevention by the dielectric layer of adverse interactions between the organic layer(s) and the cathode, whilst retaining at least some of the injection properties of the material of the cathode; and (b) the formation by the dielectric layer (e.g. with the organic layer or layers) of intermediate states that aid electron injection from the cathode. The dielectric layer should be sufficiently thin to allow the effect to occur but sufficiently thick that it can be deposited reproducibly and uniformly (without excessive defects). In general, possible mechanisms giving rise to improved performance include surface induced dipoles, modified work functions, charge transfer formation of chemically stable compounds and dissociation of the compound layer of the cathode to form a doped injection layer.

The or each organic semiconducting material may be a small molecule but is preferably a polymer. Examples of such materials include homopolymers and copolymers of optionally substituted poly(phenylene vinylenes) and optionally substituted polyfluorenes. Copolymers are particularly preferred. The organic semiconducting material may comprise, for example, triarylamines or heterocycles, in particular sulfur containing heterocycles. In one embodiment, the organic semiconducting material is a polymer comprising heterocyclic repeat units selected from optionally substituted 4,7-linked benzothiadiazole, 2,5-linked thiophene and combinations thereof The cathode may consist of a single layer of conductive material, in particular a metal such as aluminum or an alloy. Alternatively, the cathode may comprise more than one layer of conductive material, in particular the cathode may be a bilayer comprising two metals of differing workfunctions. In a first embodiment, the cathode comprises a layer of aluminum. Preferably, the layer of aluminum has a thickness in the range of 200 to 700 nm. In a second embodiment, the cathode comprises a bilayer of calcium and aluminum wherein the layer of calcium is in contact with the layer of dielectric material. Preferably, the calcium layer has a thickness of 5–25 Å.

Preferably, a hole injecting layer comprising PEDOT:PSS is located between the anode and the semiconducting material.

By "red electroluminescent organic semiconducting material" is meant an organic material that by electroluminescence emits radiation having a wavelength in the range of 600–750 nm, preferably 600–700 nm, more preferably 610–650 nm and most preferably having an emission peak around 650–660 nm.

By "green electroluminescent organic semiconducting material" is meant an organic material that by electroluminescence emits radiation having a wavelength in the range of 510–580 nm, preferably 510–570 nm.

By "blue electroluminescent organic semiconducting material" is meant an organic material that by electroluminescence emits radiation having a wavelength in the range of 400–500 nm, more preferably 430–500 nm.

By "major component" of the electron transport layer is meant a component comprising 50–100%, preferably more than 90%, most preferably substantially all, of the electron transport layer.

BRIEF DESCRIPTION OF THE DRAWINGS

The present invention will now be described in further detail, by way of example only, with reference to the accompanying drawings in which.

EXAMPLES

A) Monochrome Electroluminescent Devices

The following examples describe the preparation of electroluminescent devices wherein the electroluminescent material comprises sulfur and the cathode comprises a barium halide layer for the purpose of comparison with corresponding devices not having a layer comprising barium.

Figure 1:
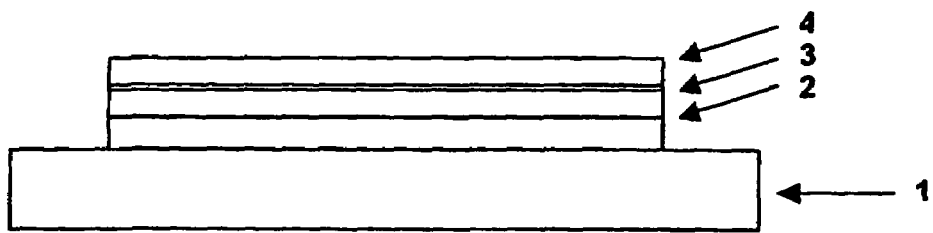
FIG. 1 shows a prior art electroluminescent device
Figure 2:
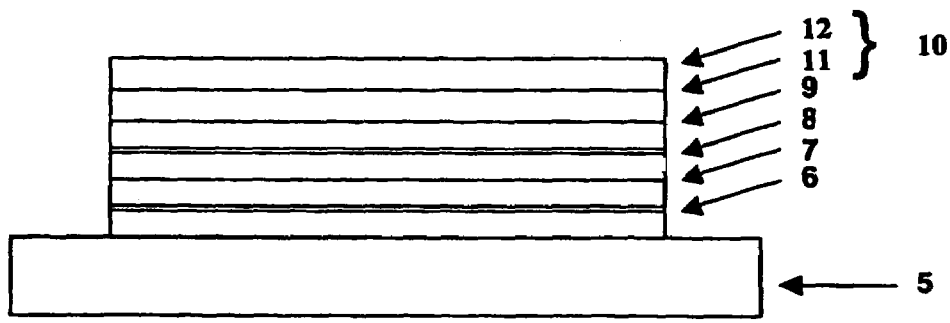
FIG. 2 shows an electroluminescent device according to the examples

FIG. 2 shows an organic light-emissive device according to the examples. The device comprises a transparent glass or plastic substrate 5. Over the substrate is a transparent anode electrode 6 formed of ITO. Over the anode is hole injecting layer 7 of poly(ethylene dioxythiophene)/polystyrene sulfonate (PEDOT-PSS). Over the hole injecting layer is organic light-emissive material 8 and over that is a dielectric electron transport layer 9 of barium fluoride capped with a cathode 10 comprising a layer of calcium 11 and a layer of aluminum 12.

To form the device of FIG. 2 a transparent layer of ITO to form the anode 6 is deposited on a sheet of glass 5. The glass sheet could be a sheet of sodalime or borosilicate glass having a thickness of, for instance, 1 mm. The thickness of the ITO coating is suitably around 100 to 150. The substrate 5 and the anode electrode 6 may be a pre-prepared commercially available ITO-coated glass sheet.

Over the ITO is deposited a hole injecting layer 7 formed from a solution containing poly(ethylene dioxythiophene)/polystyrene sulfonate (PEDOT:PSS) with a PEDOT:PSS ratio of around 1:5. The thickness of the hole transport layer is around 500 Å. The hole transport layer is spin-coated from solution and then baked at around 200° C. for 1 hour in a nitrogen environment.

Then the electroluminescent material 8 is deposited. Monochrome red and green devices according to the invention, hereinafter referred to as the red device and green device respectively, were prepared in accordance with this example wherein the electroluminescent layers are as follows:

Red device: blend of F8BT, TFB and Red
Green device: blend of Host and F8BT
F8BT=poly(2,7-(9,9-di-n-octylfluorene)-co-3,6-benzothiadiazole)
TFB=poly(2,7-(9,9-di-n-octylfluorene)-co-(1,4-phenylene-((4-sec-butylphenyl)amino)-1,4-phenylene)
Red=poly(2,7-(9,9-di-n-octylfluorene)-co-(2,5-thienylene-3,6-benzothiadiazole-2,5-thienylene)
Host=random copolymer of 90% 2,7-(9,9-di-n-octylfluorene) and 10% 1,4-phenylene-((4-sec-butylphenyl)amino)-1,4-phenylene The preparation of these materials is disclosed in WO 99/54385, WO 00/46321 and WO 00/55927, the contents of which are incorporated herein by reference.

In order to assess the suitability of this device architecture for a full color display, an analogous blue device was also prepared wherein the electroluminescent layer comprises a random copolymer of poly(2,7-(9,9-di-n-octylfluorene), 1,4-phenylene-((4-sec-butylphenyl)amino)-1,4-phenylene and 1,4-phenylene-((4-n-butylphenyl)amino)-1,4-phenylene-((4-n-butylphenyl)amino)-1,4-phenylene.

The electroluminescent material for these monochrome devices is spin-coated to a thickness of around 750 Å.

The electron transporting layer 9 comprising barium is then deposited by evaporation to a thickness of around 4 nm followed by formation of the cathode 10 by evaporation of a calcium layer 11 to a thickness of around 15 Å and a layer of valuminum 12 to a thickness of around 4000 Å. Preferably the vacuum is not broken between evaporation of successive layers to reduce contamination of the interfaces between layers. If a dielectric material such as barium fluoride is to be deposited, evaporation of this material at least is preferably done at a very low rate: preferably less than 1 Å/s, although somewhat higher rates could be used. Preferably, before the material of each cathode layer is deposited it is outgassed by being held at an elevated temperature below its evaporation point—conveniently around 650 to 670° C.—for around 5 to 10 minutes.

A power supply is connected between the anode 6 and layer 12 of the cathode 10. The power supply is arranged to apply a voltage between the electrodes so as to make cathode 10 electrically negative with respect to anode 6.

Finally, the device is encapsulated with an epoxy resin.

B) Full Color Electroluminescent Device

A full color display display device according to the invention may be prepared in accordance with the method outlined above except that the device comprises red, green and blue electroluminescent materials which are advantageously deposited by an inkjet printing process rather than by spin coating as disclosed in, for example, EP 0880303.

Device Performance

Performance of red, green and blue monochrome devices comprising a barium fluoride/calcium/aluminum cathode was compared with the performance of devices comprising prior art cathodes lithium fluoride/calcium/aluminum and calcium/aluminum. Through these comparisons, the present inventors have found that use of an electron transport layer comprising barium apparently does not result in the deleterious interactions with the electroluminescent layers comprising sulfur that electron transport layers comprising lithium are prone to.

Comparative devices were prepared in accordance with the monochrome device examples outlined above except that electron transporting layer 9 comprising barium fluoride was either replaced with lithium fluoride or not deposited at all.

Figure 3:
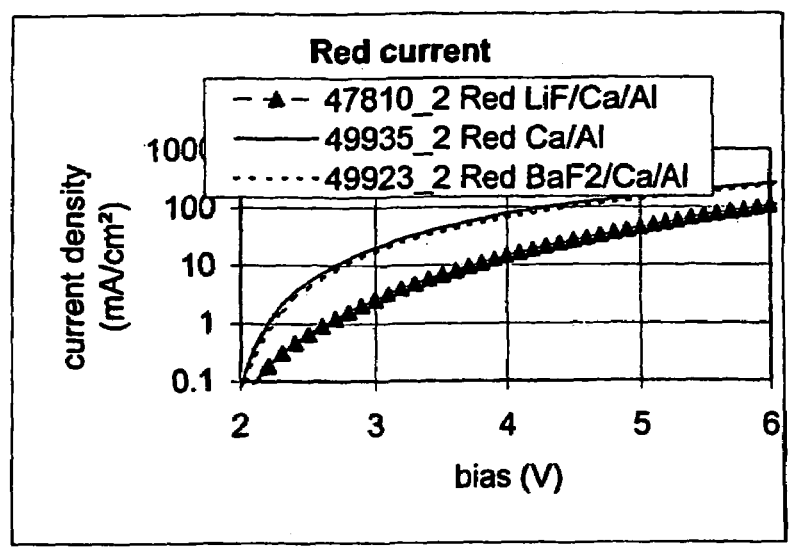
FIG. 3 shows a plot of current density vs. bias for a red electroluminescent device
Figure 4:
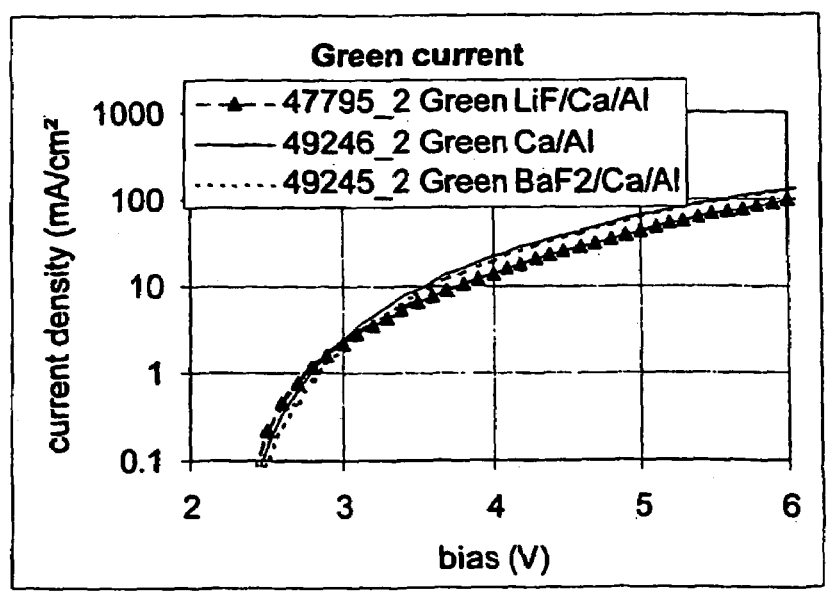
FIG. 4 shows a plot of current density vs. bias for a green electroluminescent device

FIGS. 3 and 4 show comparative plots of current density vs. bias for, respectively, the red device and green device. This illustrates the bias required for device operation—as can be seen, devices according to the invention show similar performance to the comparative devices. The same comparative data for a blue device also showed comparable performance with the three cathodes.

Figure 5:
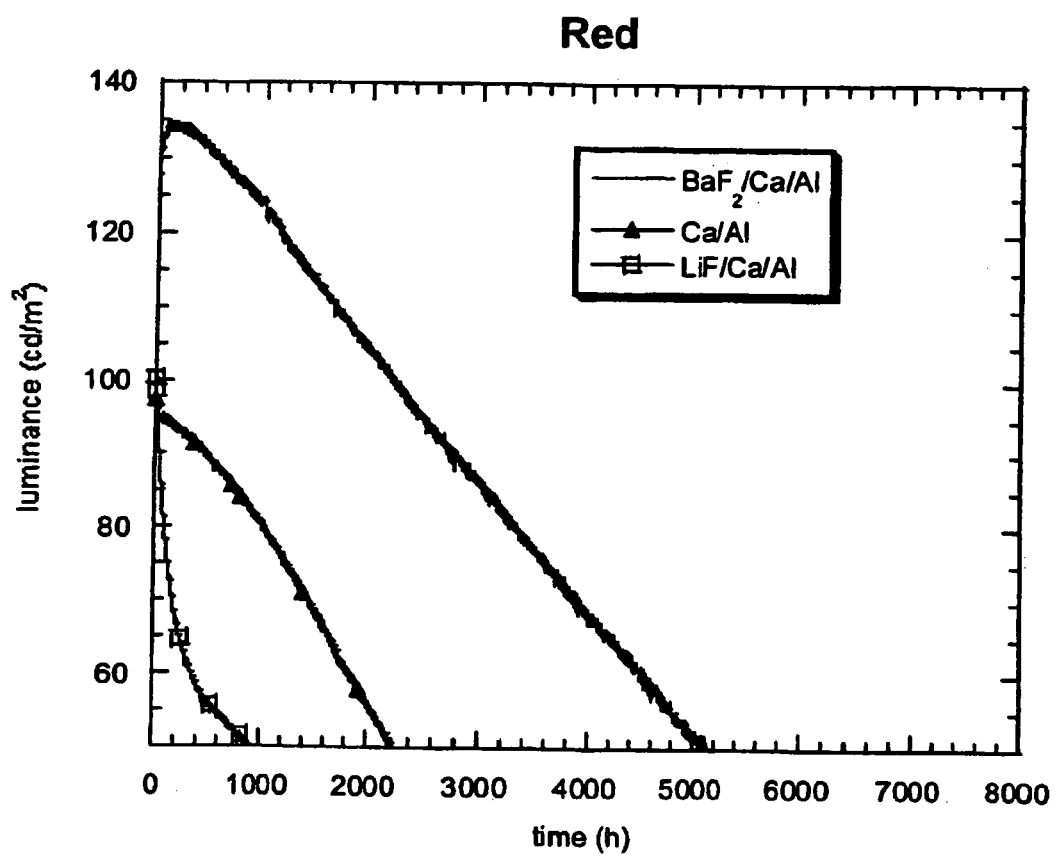
FIG. 5 shows a plot of luminance vs. time for a red electroluminescent device
Figure 6:
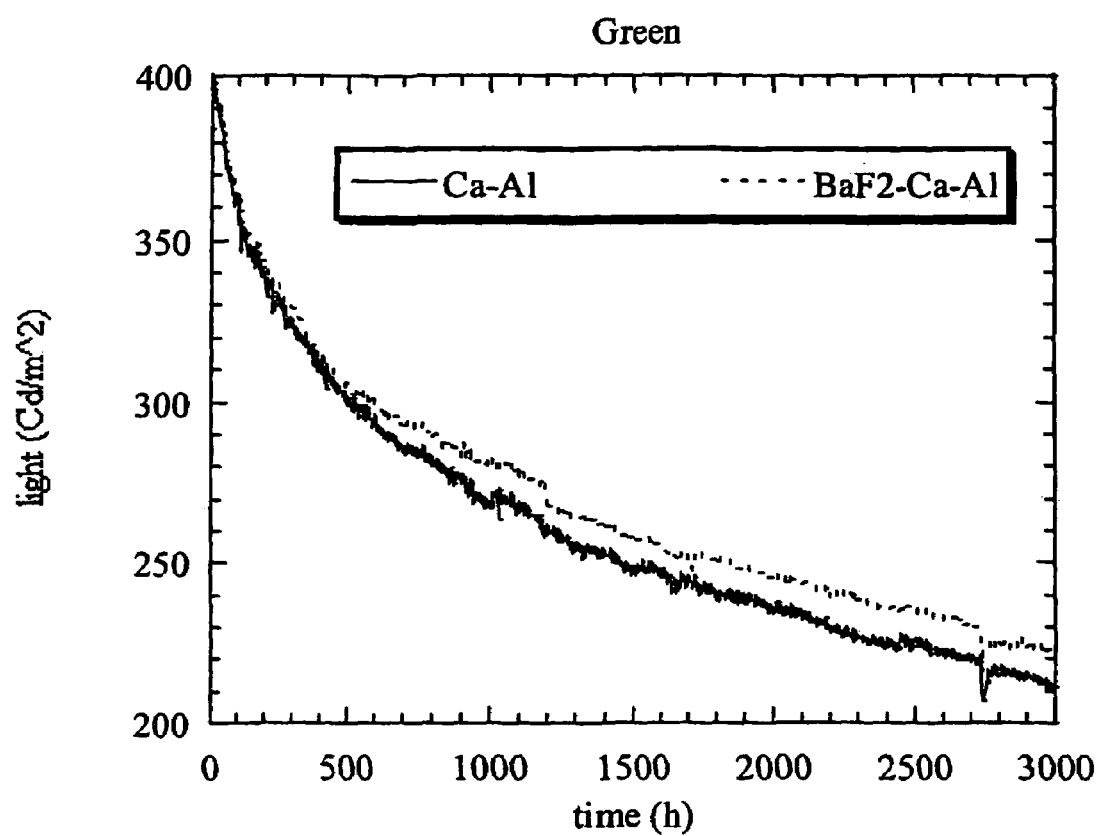
FIG. 6 shows a plot of luminance vs. time for a green electroluminescent device
Figure 7:
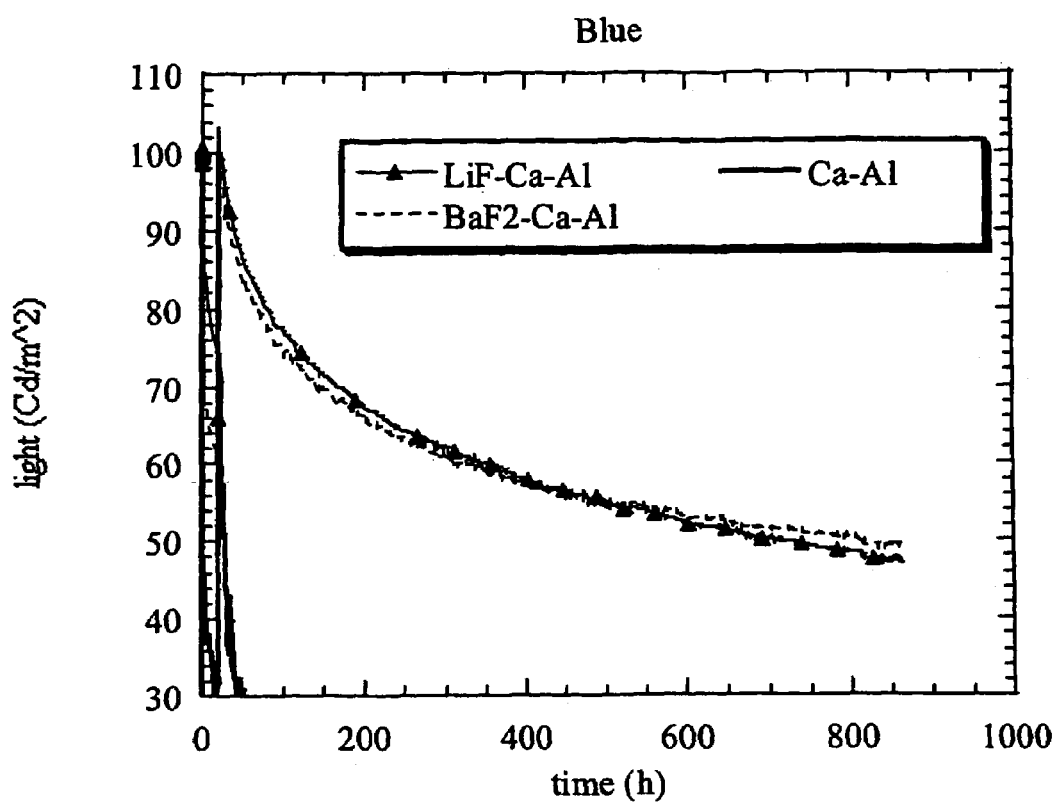
FIG. 7 shows a plot of luminance vs. time for a blue electroluminescent device

FIGS. 5 and 6 show the luminance over time for the red device and green device and FIG. 7 shows the same data for the blue device. As can be seen from FIG. 5, the luminance over time of red devices having a barium fluoride/calcium/aluminum is superior to that of red devices with a lithium fluoride/calcium/aluminum cathode or a calcium/aluminum cathode. The difference between the device according to the invention with a barium fluoride/calcium/aluminum cathode and the comparative device with a lithium fluoride/calcium/aluminum cathode is particularly marked. In addition, FIG. 7 shows that a device having a calcium/aluminum cathode shows particularly poor lifetime when used with the blue emissive material whereas devices having the barium fluoride/calcium/aluminum cathode do not show any particular weakness.

Furthermore, it has been established that performance of the green and, especially, the red devices (i.e. devices with organic electroluminescent layers comprising sulfur) having a lithium fluoride/calcium/aluminum cathode show a very significant fall in lifetime when left in an off state for any length of time. By comparison, it has been found that the lifetime of the red and the green devices having a barium fluoride/calcium/aluminum cathode remains constant regardless of whether they are driven constantly or left in an off state for a length of time.

Elemental barium has also been employed as the electron transport layer, for example in combination with a layer of silver as the cathode, and has been found to possess essentially the same advantages as a barium fluoride electron transport layer over devices not containing barium, as outlined above.

Without wishing to be bound by any theory, it is believed that lithium may be able to migrate into the electroluminescent material and bind to sulfur containing species, thus quenching the electroluminescence of these species whereas the larger barium atom or ion is much less capable of such migration.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. An optical device comprising
   an anode;
   a cathode;
   an organic semiconducting material between the anode and the cathode; and,
   an electron transport layer between the cathode and the organic semiconducting material, wherein the organic semiconducting material comprises sulfur and the electron transport layer comprises elemental barium as a major component.

2. An optical device according to claim 1, wherein the semiconducting material is a polymer.

3. An optical device according to claim 1, wherein the semiconducting material comprises a sulfur containing heterocyclic repeat unit.

4. An optical device according to claim 1, wherein the organic semiconducting material is a red organic electroluminescent material.

5. An optical device according to claim 1, wherein the organic semiconducting material is a green organic electroluminescent material.

6. An optical according to claim 1, wherein the electron transport layer comprising elemental barium has a thickness in the range of 1 nm to 6 nm.

7. An optical device according to claim 1, wherein a hole injecting layer comprising PEDOT:PSS is located between the anode and the semiconducting material.

8. An optical device according to claim 1, wherein the optical device is an electroluminescent device.

9. An optical device according to claim 1, wherein the cathode comprises a layer of aluminum.

10. An optical device according to claim 9, wherein the cathode further comprises a layer of calcium disposed between the electron transport layer and the layer of aluminum.

11. An optical device comprising
an anode;
a cathode;
an organic semiconducting material between the anode and the cathode; and,
an electron transport layer between the cathode and the organic semiconducting material,
wherein the organic semiconducting material comprises sulfur, and the electron transport layer comprises a barium compound selected from the group consisting of barium halides and barium oxide as a major component.

12. An optical device according to claim 11, wherein the semicoxiducting material is a polymer.

13. An optical device according to claim 11, wherein the semiconducting material comprises a sulfur containing heterocyclic repeat unit.

14. An optical device according to claim 11, wherein the organic semiconducting material is a red organic electroluminescent material.

15. An optical device according to claim 11, wherein the organic semiconducting material is a green organic electroluminescent material.

16. An optical according to claim 11, wherein the electron transport layer comprising a barium compound has a thickness in the range of 1 nm to 6 nm.

17. An optical device according to claim 11, wherein a hole injecting layer comprising PEDOT:PSS is located between the anode and the semiconducting material.

18. An optical device according to claim 11, wherein the optical device is an electroluminescent device.

19. An optical device according to claim 11, wherein the cathode comprises a layer of aluminum.

20. An optical device according to claim 19, wherein the cathode further comprises a layer of calcium disposed between the electron transport layer and the layer of aluminum.

21. An optical device comprising
an anode;
a cathode;
an organic semiconducting material between the anode and the cathode; and,
an electron transport layer between the cathode and the organic semiconducting polymer,
wherein the organic semiconducting material is a polymer comprising sulfur and optionally substituted polyfluorene units, and the electron transport layer comprises barium.

22. An optical device according to claim 21, wherein the electron transport layer comprises a barium compound as a major component.

23. An optical device according to claim 21, wherein the organic semiconducting material is a red organic electroluminescent material.

24. An optical device according to claim 21, wherein the organic semiconducting material is a green organic electroluminescent material.

25. An optical according to claim 21, wherein the electron transport layer comprising barium has a thickness in the range of 1 nm to 6 nm.

26. An optical device according to claim 21, wherein a hole injecting layer comprising PEDOT:PSS is located between the anode and the semiconducting material.

27. An optical device according to claim 21, wherein the optical device is an electroluminescent device.

28. An optical device according to claim 21, wherein the cathode comprises a layer of aluminum.

29. An optical device according to claim 28, wherein the cathode further comprises a layer of calcium disposed between the electron transport layer and the layer of aluminum.

30. An optical device comprising
an anode;
a cathode;
an organic semiconducting material between the anode and the cathode; and,
an electron transport layer between the cathode and the organic semiconducting material,
wherein the organic semiconducting material comprises a sulfur containing heterocyclic repeat unit selected from the group consisting of optionally substituted 4,7-linked benzothiadiazole, 2,5-linked thiophene, and combinations thereof, and the electron transport layer comprises barium.

31. An optical device according to claim 30, wherein the electron transport layer comprises a barium compound as a major component.

32. An optical device according to claim 30, wherein the organic semiconducting material is a red organic electroluminescent material.

33. An optical device according to claim 30, wherein the organic semiconducting material is a green organic electroluminescent material.

34. An optical according to claim 30, wherein the electron transport layer comprising barium has a thickness in the range of 1 nm to 6 nm.

35. An optical device according to claim 30, wherein a hole injecting layer comprising PEDOT:PSS is located between the anode and the semiconducting material.

36. An optical device according to claim 30, wherein the optical device is an electroluminescent device.

37. An optical device according to claim 30, wherein the cathode comprises a layer of aluminum.

38. An optical device according to claim 37, wherein the cathode further comprises a layer of calcium disposed between the electron transport layer and the layer of aluminum.

39. An optical device comprising
an anode;
a cathode;
red, green, and blue electroluminescent organic semiconducting materials between the anode and the cathode; and,
an electron transport layer between the cathode and the electroluminescent organic semiconducting materials,
wherein the electron transport layer comprises elemental barium as a major component.

40. An optical device according to claim 39, wherein at least one of the electroluminescent organic semiconducting materials is a polymer.

41. An optical device according to claim 39, wherein at least one of the electroluminescent organic semiconducting materials comprises a sulfur containing heterocyclic repeat unit.

42. An optical according to claim 39, wherein the electron transport layer comprising elemental barium has a thickness in the range of 1 nm to 6 nm.

43. An optical device according to claim 39, wherein a hole injecting layer comprising PEDOT:PSS is located between the anode and the semiconducting material.

44. An optical device according to claim 39, wherein the cathode comprises a layer of aluminum.

45. An optical device according to claim 44, wherein the cathode further comprises a layer of calcium disposed between the electron transport layer and the layer of aluminum.

46. An optical device comprising
an anode;
a cathode;
red, green, and blue electroluminescent organic semiconducting materials between the anode and the cathode; and,
an electron transport layer between the cathode and the electroluminescent organic semiconducting materials,
wherein the electron transport layer comprises a barium compound selected from the group consisting of barium halides and barium oxide as a major component.

47. An optical device according to claim 46, wherein at least one of the electroluminescent organic semiconducting materials is a polymer.

48. An optical device according to claim 46, wherein at least one of the electroluminescent organic semiconducting materials comprises a sulfur containing heterocyclic repeat unit.

49. An optical according to claim 46, wherein the electron transport layer comprising a barium compound has a thickness in the range of 1 nm to 6 nm.

50. An optical device according to claim 46, wherein a hole injecting layer comprising PEDOT:PSS is located between the anode and the semiconducting material.

51. An optical device according to claim 46, wherein the cathode comprises a layer of aluminum.

52. An optical device according to claim 51, wherein the cathode further comprises a layer of calcium disposed between the electron transport layer and the layer of aluminum.

53. An optical device comprising
an anode;
a cathode;
red, green, and blue electroluminescent organic semiconducting materials located between the anode and the cathode; and,
an electron transport layer between the cathode and the organic semiconducting materials,
wherein at least one of the electroluminescent organic semiconducting materials is a polymer comprising optionally substituted polyfluorene units, and the electron transport layer comprises barium.

54. An optical device according to claim 53, wherein the electron transport layer comprises a barium compound as a major component.

55. An optical according to claim 53, wherein the electron transport layer comprising barium has a thickness in the range of 1 nm to 6 nm.

56. An optical device according to claim 53, wherein the cathode comprises a layer of aluminum.

57. An optical device according to claim 53, wherein the cathode further comprises a layer of calcium disposed between the electron transport layer and the layer of aluminum.

58. An optical device according to claim 53, wherein a hole injecting layer comprising PEDOT:PSS is located between the anode and the semiconducting material.

59. An optical device comprising
an anode;
a cathode;
red, green, and blue electroluminescent organic semiconducting materials located between the anode and the cathode; and,
an electron transport layer between the cathode and the organic semiconducting materials,
wherein at least one of the electroluminescent organic semiconducting materials comprises a sulfur containing heterocyclic repeat unit selected from the group consisting of optionally substituted 4,7-linked benzothiadiazole, 2,5-linked thiophene, and combinations thereof, and the electron transport layer comprises barium.

60. An optical device according to claim 59, wherein the electron transport layer comprises a barium compound as a major component.

61. An optical according to claim 59, wherein the electron transport layer comprising barium has a thickness in the range of 1 nm to 6 nm.

62. An optical device according to claim 59, wherein a hole injecting layer comprising PEDOT:PSS is located between the anode and the semiconducting material.

63. An optical device according to claim 59, wherein the cathode comprises a layer of aluminum.

64. An optical device according to claim 63, wherein the cathode further comprises a layer of calcium disposed between the electron transport layer and the layer of aluminum.

* * * * *

UNITED STATES PATENT AND TRADEMARK OFFICE
CERTIFICATE OF CORRECTION

PATENT NO. : 7,141,818 B2  Page 1 of 1
APPLICATION NO. : 10/488073
DATED : November 28, 2006
INVENTOR(S) : Salvatore Cina It is certified that error appears in the above-identified patent and that said Letters Patent is hereby corrected as shown below:

In the Claims:

At Column 7, line 15, "optical according" should be -- optical device according --.

At Column 7, line 42, "semicoxiducting" should be -- semiconducting --.

At Column 7, line 51, "optical according" should be -- optical device according --.

At Column 8, line 18, "optical according" should be -- optical device according --.

At Column 8, line 54, "optical according" should be -- optical device according --.

At Column 9, line 18, "optical according" should be -- optical device according --.

At Column 9, line 49, "optical according" should be -- optical device according --.

At Column 10, line 16, "optical according" should be -- optical device according --.

At Column 10, line 47, "optical according" should be -- optical device according --.

Signed and Sealed this

Sixth Day of May, 2008

JON W. DUDAS
*Director of the United States Patent and Trademark Office*